United States Patent [19]
Hall et al.

[11] Patent Number: 5,514,982
[45] Date of Patent: May 7, 1996

[54] LOW NOISE LOGIC FAMILY

[75] Inventors: David W. Hall, Satellite Beach; J. G. Dooley; Arecio A. Hernandez, both of Melbourne, all of Fla.

[73] Assignee: Harris Corporation, Melbourne, Fla.

[21] Appl. No.: 292,482

[22] Filed: Aug. 18, 1994

[51] Int. Cl.$^6$ .......................... H03K 19/08; H03K 19/003
[52] U.S. Cl. ................................ 326/83; 326/30; 326/115; 326/119
[58] Field of Search ................................ 326/83, 30, 119, 326/120, 115

[56] References Cited

U.S. PATENT DOCUMENTS

| | | | |
|---|---|---|---|
| 3,700,981 | 10/1972 | Masuhara et al. | 326/120 |
| 3,917,958 | 11/1975 | Hatsukano | 326/115 |
| 4,661,725 | 4/1987 | Chantepie | 326/115 |
| 4,885,479 | 12/1989 | Oritani | 326/83 |
| 4,924,116 | 5/1990 | Vu et al. | 326/115 |

FOREIGN PATENT DOCUMENTS 21324    1/1987    Japan.

OTHER PUBLICATIONS

P. R. Gray & R. G. Meyer, "Analog Integrated Circuits", 2nd Ed., John Wiley & Sons, pp. 61-70, 1984, New York.
Allstot et al., "Analog Logic Techniques Steer Around The Noise", IEEE Journal of Circuits & Devices, pp. 18–21, 1993.

D. J. Allstot, S. Kiaei, & R. H. Zele, "Analog Logic Techniques Steer Around the Noise", IEEE Journal of Circuits & Devices, pp. 18–21, 1993.

*Primary Examiner*—Edward P. Westin
*Assistant Examiner*—Richard Roseen
*Attorney, Agent, or Firm*—Nixon, Hargrave, Devans & Doyle

[57] ABSTRACT

A low noise logic (LNL) family is disclosed. An inverter 10 has a pair of load devices NL1, NL2 coupled to the drains of NMOS transistors N 1, N2. The input signal is coupled to the gate of N 1. The drain of N 1 is coupled to the gate of N2. A constant current source 12 is coupled between $V_{ss}$ and the sources of the transistors N1,N2. Trickle current devices NTR1, NTR2 are coupled to the drains of N 1, N2, respectively to insure input control of the output states. A high logic signal on the gate of N1 steers the constant current to the load NL1 and turns NL2 off. A low logic signal on the gate of N1 turns N1 off and applies a high voltage to the gate of N2, turning N2 on. N2 steers the constant current to NL2.

42 Claims, 2 Drawing Sheets

LOW NOISE LOGIC FAMILY

GOVERNMENT INTEREST

Low Noise Logic (LNL) was developed under NSA contract number MDA-904-92-C-5101.

This invention relates in general to logic families, and, in particular, to a low noise logic (LNL) family useful in integrated circuits.

BACKGROUND

The operation of logic circuits in integrated circuits normally requires the switching of transistors between on and off states. Such switching generates transient signals or noise. Noise can be detected on the Vss distribution line and analyzed to provide information about the signals in the logic circuit. In other devices, such as A/D converters, noise limits the resolution of the device.

It is possible to isolate CMOS switching transients from the Vssl distribution by the use of an on-chip shunt voltage regulator. The shunt voltage regulator operates from +5 V to −5 V while the CMOS logic operates from +5 V (Vdd) to ground (Vss). The shunt voltage regulator maintains a predetermined constant current flow between +5 V and Vss. CMOS logic draws current from the shunt regulator to satisfy its instantaneous needs and current not used by the CMOS logic is shunted from +5 V to Vss. The current used by the CMOS logic and current shunted are added to form an essentially constant current. The constant value of current must be set to more than any demand required by CMOS logic or noise will be detected (and hence, information). Noise reduction on the power distribution system is impressive using this technique, with noise reduction of at least −120dB. However, this technique requires a power level of more than twice the peak power consumed by the CMOS logic and an additional power supply voltage is required (−5 V).

Another possible solution to the noise problem is complementary node switching, sometimes referred to as load balancing, which produces a transition in dummy logic elements that is in opposition to the primary logic node. Dummy loads are required to fully complement the noise profile of the primary node. We discovered that the resulting Vss distribution transient noise with complementary node switching was larger than it was without using this noise control technique and gave a noise signature that permitted the extraction of data from the noise. That is an undesirable attribute for secure data communications applications. The complimentary node switching technique also required inclusion of complementary logic elements and the associated loads was very difficult to implement (if not impossible). The matching of speeds between the primary logic and its complement was not feasible. There was more noise present than when the complementary logic was not used.

Another approach for reducing the digital switching noise has been developed by Allstot, Kiaei and Zele, "Analog Logic Techniques Steer Around the Noise," IEEE Journal of Circuits & Devices, pp 18–21, September 1993. That approach uses a current steering technique that draws constant current from Vdd. The current that is dumped on the Vss distribution will see a transient current that is device parameter limited as the input transitions to a logical "1." The Iss transient may be used to determine the current-steering logic elements state level.

So, it would be desireable to have a low noise logic circuit that consumed less power than existing techniques. If the shunt voltage regulator could be eliminated, power savings (extended battery life) could be realized.

SUMMARY

This invention is based in part on our discovery that when a logic element is provided with a constant current the logic element uses that current whether or not the logic element is switching and the noise attributable to logic transitions is very small and almost undetectable. The LNL family provides a design for logical switching elements that operate under a constant current.

The LNL family includes a basic logic circuit, such as an inverter. The basic logic circuit or logic kernel has a first (high) reference voltage source coupled to a pair of load devices, preferably nonlinear loads devices. One load device is coupled to an input terminal of a first switching transistor. An input logic signal is coupled to the control terminal of the first switching transistor. The second load device is coupled to the input terminal of a second switching transistor. The control electrode of the second switching transistor is also coupled to the input terminal of the first switching transistor. The outputs of both switching transistors are coupled to a constant current source which is coupled to a second (low) reference voltage source. The constant current source is a transistor with a control electrode kept at a control voltage $V_{BIAS}$. The input terminal of the second switching transistor provides a true output signal that matches the logic state of the input logic signal. The input terminal of the first switching transistor provides a complementary output signal that is the opposite state of the input logic signal.

For a high or 1 input logic signal on the control electrode of the first switching transistor, that transistor is on, it steers the constant current to the first load device and it couples the input terminal of the first switching transistor to the output of the transistor used as a constant current source. The control electrode of the transistor used as a constant current source is connected to the reference voltage $V_{BIAS}$ voltage, typically 1.1 V. The input of the constant current source is coupled to a second (low) reference voltage, typically grounded. The complementary output, coupled to the input of the first switching transistor, is low or 0. The control electrode of the second switching transistor is coupled to the input of the first switching transistor. The output of the second switching transistor is connected to the output of the transistor used as the constant current source and the output of the first switching transistor. The input of the second switching transistor then rises to the voltage at the second load device which is a predetermined voltage drop below the first (high) reference voltage. The true output of the logic kernel is coupled to the input of the second switching transistor and has a high voltage level corresponding to a logical 1.

When the input logic signal changes state from high (1) to low (0), the first switching transistor turns off and its input rises to the voltage at the first load device, i.e., a high voltage. That high voltage corresponds to a logical 1 and appears on the complementary output that is coupled to the input of the first switching transistor. The level of the voltage on the input of the first switching transistor is a predetermined voltage below the first reference voltage. The control electrode of the second switching transistor, being coupled to the high voltage on the input to the first switching transistor, turns on the second switching transistor and steers the constant current to the second load device. The input terminal of the second switching transistor is then coupled through the constant current source to the second (low) reference voltage. So, the true output of the logic kernel is low or 0.

The input of each switching transistor is coupled to a trickle current device. The trickle current devices drain enough current from each of the load devices to ensure that each input will remain below the first reference voltage when the switching transistor is off. It is recognized that the switching transistors will have some leakage current. It is necessary to provide a trickle current greater than the leakage current to ensure that the switching transistor will not turn on when it should remain off. Without a trickle current, over time the leakage current may allow the input terminal of the off switching transistor to rise to the level of the first (high) reference voltage source.

DETAILED DESCRIPTION

Figure 1:
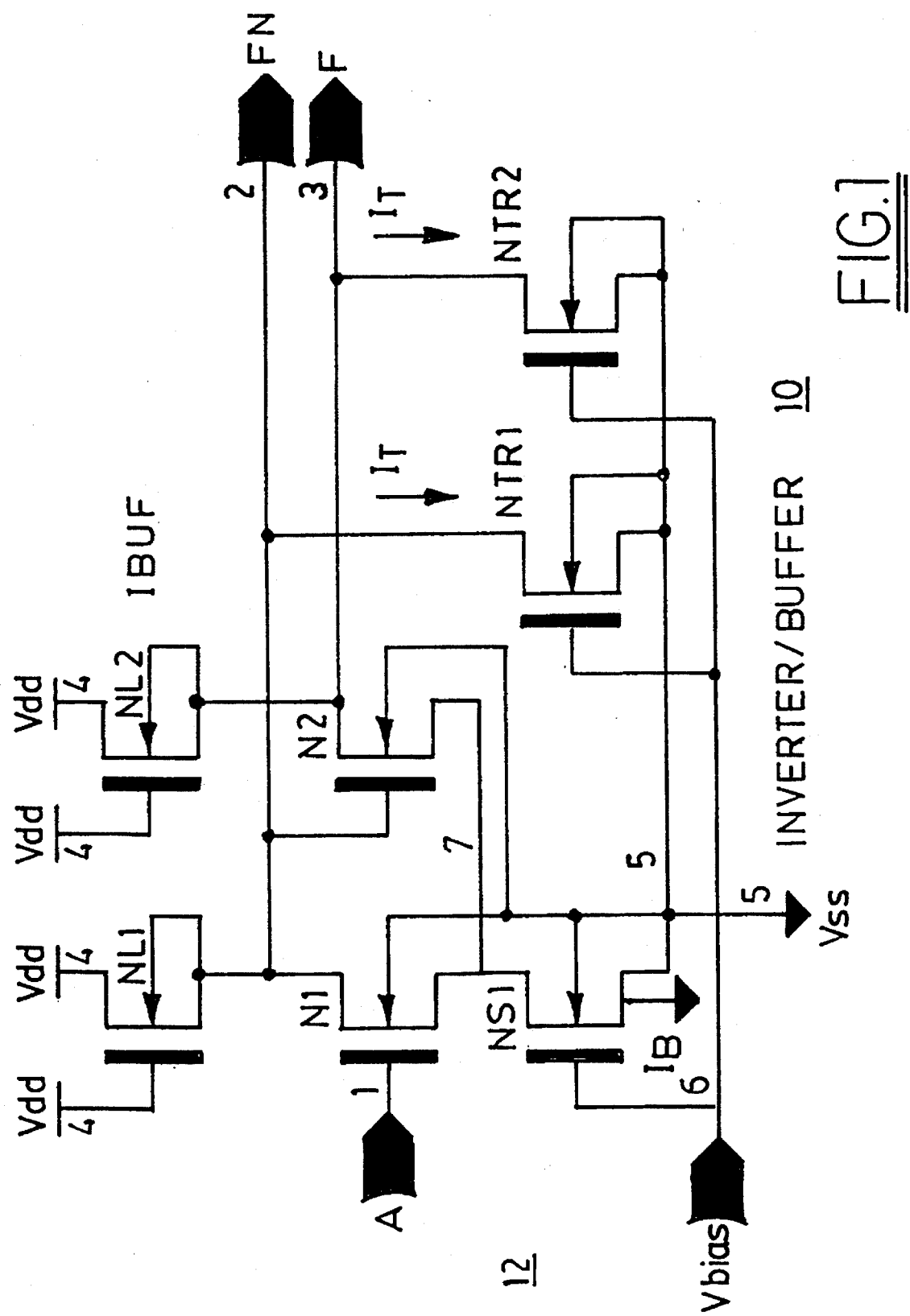
FIG. 1 shows a schematic representation of a basic logic kernel in the form of a inverter.

With reference to FIG. 1, the LNL family includes a basic logic circuit, such as an NMOS inverter 10. The inverter 10 has a first (high) reference voltage source $V_{dd}$ coupled to a pair of load devices NL1 and NL2. The load devices NL1, NL2 are nonlinear loads devices, typically each a NMOS transistor with its drain and gate coupled to $V_{dd}$. As such, each of the devices NL1,NL2 is predetermined voltage drop below $V_{dd}$. Load device NL1 is coupled to the drain or input terminal of first switching NMOS transistor N1. An input logic signal at input terminal A is coupled to the gate of N1. The second load device NL2 is coupled to the drain of a second NMOS switching transistor N2. The gate of N2 is also coupled to the drain of N1. The sources of N1 and N2 switching transistors are coupled to a constant current source 12. The constant current source 12 includes NMOS transistor NS1 with its gate connected to a voltage source $V_{BIAS}$ and its source coupled to a second reference voltage, Vss or ground. The constant current source 12 is kept at its constant current $I_B$ by a control voltage $V_{BIAS}$. The drain terminal of the second switching transistor N2 is coupled to true output terminal F and provides a true output signal that matches the logic state of the input logic signal on input terminal A. The drain terminal of the first switching transistor N1 provides a complementary output signal on output terminal FN. The complementary output signal is the opposite logical state of the input logic signal.

For a high or 1 input logic signal the first switching transistor N1 is on and steers the constant current $I_B$ to the first load device NL1 and couples the first switching transistor N1 to the output of the constant current source 12. The gate electrode of the second switching transistor N2 is also coupled to the drain of the first switching transistor N1 and through N1 to NS1 and $V_{ss}$. Becuase the gate of N2 is tied to the drain of N1 on and with the sources of N1 and N2 tied together, the gate-to-source voltage for N2 is insufficient to turn N2 in. With N2 off the voltage level at output F rises to a high voltage (1) at the output of NL2. The complementary output FN, coupled via N1 and NS1 to $V_{ss}$ (0). The drain of N2 then rises to the voltage at the second load device NL2 which is a predetermined voltage drop below $V_{dd}$. The true output F of the logic kernel 10, coupled to the drain of N2, has a high voltage level corresponding to a logical 1. When the input logic signal changes state, the first switching transistor N1 turns off and its drain rises to a high voltage, i.e. a voltage that is a predetermined voltage drop below $V_{dd}$. That high voltage corresponds to a logical 1 and appears on the complementary output FN that is coupled to the drain of N1. The gate electrode of N2, being coupled to the high voltage on the drain of N1, turns on N2. The drain of N2 is then coupled through the constant current source 12 to $V_{ss}$. So, the true output F of the logic kernel 10 is low or 0. For a low or 0 input logic signal the first switching transistor N1 is off and high voltage appears on the gate of N2. A high voltage on the gate of N2 turns N2 on and N2 steers the constant current $I_B$ from source 12 to NL2. With NL2 coupled to $V_{ss}$ through N2 and current source 12, the output FN will be high (1).

The drains of switching transistor N1, N2 are coupled respectively to trickle current devices NTR1, NTR2. The trickle current devices NTR1, NTR2 drain enough current from each of the switching transistor N1, N2 to ensure that each transistor N1, N2 will remain below $V_{dd}$ when the switching transistor N1, N2 is off. It is recognized that the NMOS switching transistors N1, N2 will have some leakage current. It is necessary to provide a trickle current greater than their leakage currents to ensure that the switching transistors N1, N2 will not turn on when they should be off. Without a trickle current, over time the leakage current in N1 or N2 would gradually allow the drain terminal of N1 or N2 to rise to the level of $V_{dd}$.

NTR1 and NTR2 keep a small trickle current (relative to $I_B$) flowing in the load device NL1, NL2 that is outputting a 1. Without NTR1, the FN output might rise to Vdd through leakage currents in NL1 being greater than leakage currents in N1. In this condition, logic signals at input A could not be guaranteed to control the states of F and FN. This is a problem at low frequencies where FN might be left in the 1 state long enough for FN to slowly reach Vdd. Since this is a low frequency problem it is possible that testing the unit in a production environment might not reveal the failure. The current provided by NTR1 is sufficiently greater than the leakage current of NL1 to ensure that the output states of N1 and N2 can be controlled by the input A.

The output levels are determined by using the current equation solved for the Vgs variable as illustrated with equations 1 and 2.[1]

$$I_{DS} \cong \left( \frac{k' * W}{L_{eff}} \right) * (V_{GS} - V_{t0})^2 \qquad (1)$$

$$V_{GS} \cong \left[ \sqrt{\frac{I_{DS} * L_{eff}}{k' * W}} \right] + V_{t0} \qquad (2)$$

P. R. Gray & R. G. Meyer, "ANALOG INTEGRATED CIRCUITS," 2nd Ed., John Wiley & Sons, New York, 1984, pp. 61–70. Where $I_{DS}$ is the drain to source device current, k' is the MOS gain constant, W and $L_{eff}$ are the MOS channel width and effective length respectively, $V_{GS}$ is the MOS gate to source voltage and $V_{t0}$ is the MOS threshold voltage.[2]
A. S. Grove, "PHYSICS AND TECHNOLOGY OF SEMICONDUCTOR DEVICES, " John Wiley & Sons, New York, 1967 pp. 321–329.

Typical values for $V_{T0}$, k', L and W are respectively 0.7 V, $20*10^{-6}$ Amperes/Volt$^2$, $1.2*10^{-4}$ cm and $4.5*10^{-4}$ cm for devices NL1 and NL2. $I_{DS}$, for NL1, approximates 33 μA while in and 0 state the 1 μA while in the 1 state. Using these values and the second approximation above, the output levels may be determined as shown in equations 3 and 4.

$$\text{"1" Level} = V_{OH} = Vdd - V_{GS}|_{I_{DS\_NL1=1\mu A}} \cong 4185V \qquad (3)$$

-continued $$\text{"0" Level} = V_{OL} = Vdd - V_{GS}|_{I_{DS\_NL1}=33\mu A} \cong 3.637V \tag{4}$$

This reveals a total output transition of 0.548 V which is about 11% of the corresponding CMOS transition range. A benefit of the reduced switching range of LNL is that LNL will radiate reduced amounts of signal (relative to CMOS) into adjacent wiring.

The input to an LNL function may be directly driven with a standard CMOS level signal, although the noise appearing as a ΔIss transient will be larger than if the input were driven with LNL levels. The LNL output levels cannot drive standard CMOS directly. A series of LNL to CMOS level converters was developed for this case.

The transition characteristic for purely capacitive loads is defined by solving integral equations 5 and 6.

for $V_{OUTPUT\_FALL}$ $$\left\{ (I_B + I_{TR}) - \left( \frac{k'*W}{L_{eff}} \right) * (Vdd - V_{OUT} - V_{t0})^2 \right\} * \tag{5}$$

$$\int_{t0}^{t} dt - C_L * \int_{v_{OUT}}^{v_{OH}} dV = 0$$

for $V_{OUTPUT\_RISE}$ $$\left\{ I_{TR} - \left( \frac{k'*W}{L_{eff}} \right) * (Vdd - V_{OUT} - V_{t0})^2 \right\} * \tag{6}$$

$$\int_{t0}^{t} dt - C_L * \int_{v_{OUT}}^{v_{OL}} dV = 0$$

where $i_B$ is the bias current developed by NS1 (sometimes referred to as $I_{BIAS}$), $I_{TR}$ is the trickle developed by NTR1 (and NTR2), $L_{eff}$ is the effective channel length of NL1 (or NL2) and W is the channel width of NL1 (or NL2).

The solutions to these integral equations for $V_{OUTPUT\_FALL}$ and $V_{OUTPUT\_RISE}$ as a function of t, for t>0, are provided in equations 7 and 8.

for $V_{OUTPUT\_FALL}$ as a function of time $$V_{OUT\_FALL}(t) = Vdd - V_t + \left( \frac{C_L * L_{eff}}{2 * k' * W * t} \right) + \ldots \tag{7}$$

$$- \sqrt{ \left( \frac{C_L * L_{eff}}{k' * W * t} \right) * (Vdd - V_{OH} - V_{t0}) + \left( \frac{C_L * L_{eff}}{2 * k' * W * t} \right)^2 + \frac{L_{eff}}{k' * W} * (I_B + I_{TR}) }$$

and for $V_{OUTPUT\_RISE}$ as a function of time $$V_{OUT\_RISE}(t) = Vdd - V_t + \left( \frac{C_L * L_{eff}}{2 * k' * W * t} \right) + \ldots \tag{8}$$

$$- \sqrt{ \left( \frac{C_L * L_{eff}}{k' * W * t} \right) * (Vdd - V_{OL} - V_{t0}) + \left( \frac{C_L * L_{eff}}{2 * k' * W * t} \right)^2 + \frac{I_{TR} * L_{eff}}{k' * W} }$$

where $C_L$ is the capacitance of the output node (including load and self capacitance).

Fall time is quicker than rise time due to the non-linearity of the output load (NL1 or NL2). When at the 1 level, the small signal resistance of NL1 (or NL2) may be as high as 100KΩ (refer to equation 9) and when the output is in the 0 state, the small signal resistance of NL1 may be as small as 3000Ω. The wide range listed allows for manufacturing process ranges from several foundries. In a given case, where device parameters do not vary, the ratio of small signal resistances of 1 and 0 states will be approximately 4:1. In the small signal case, the change in voltage at a LNL output in response to a change by the $I_{DS}$ current of NL1 (or NL2) is directly proportional to the magnitude of the small signal resistance of that output. The small signal DRAIN resistance of NL1 is expressed in equation 9.

$$R_{OUT} = \frac{1}{2} * \sqrt{ \frac{L_{eff}}{k' * W * I_{DS}} } \tag{9}$$

where $I_{DS}$ is $I_B + I_{TR}$ when the output is a LOGICAL 0 and $I_{DS}$ is $I_{TR}$ when the output is a LOGICAL 1.

Propagation Delay

The propagation delay of LNL is longer (slower) than the propagation delay encountered in standard CMOS when $I_B$ is maintained below approximately 256 μA. The nominal value for $I_B$ is 32 μA, in order to maintain a reasonable power/gate ratio of 1 Watt per 5000 gates. With $I_B$ set to the nominal value (32 μA) the average propagation delay of LNL was measured to be 3.98 ns when driving one load at 25° C.

Delay vs. Temperature

The dependency of delay with respect to temperature is approximately 0.25%/°C.

Delay vs. Ibias

The dependency of delay with respect to $I_B$ is shown in equation 10.

$$\text{Delay} \cong \text{Delay}|_{I_{BIAS0}} * \left( \frac{\sqrt{I_{BIAS0}}}{\sqrt{I_{BIAS}}} \right) \tag{10}$$

where $I_{BIAS0}$ is the nominal value.

Delay vs. Vdd

When $I_B$ and $I_{TR}$ are truly constant, the delay of LNL is essentially independent of Vdd. Some reduction in self capacitance (of N1 and N2) is experienced as Vdd increases which will tend to reduce delay, but this effect is slight in normal operation.

Simulations of the LNL switching kernel 10 indicated that Iss transient noise current would see a reduction of Iss transient noise between 54 and 64dB. A measured Iss current transient noise revealed that LNL was 57 to 66dB quieter than standard CMOS. The focus on Iss rather than Idd resulted from the starting material of the wafer and the process used to fabricate the evaluation samples. An N-type starting material was utilized in a junction isolated process which requires that the starting material must be connected to Vdd. In this type of semiconductor process, Vdd is the reference instead of Vss. The simulated Idd noise current transient was predicted to be between 52 and 59dB quieter than standard CMOS. Because Vdd is the reference node, no measurements of Idd isolated transients were attempted. The LNL Iss (and Idd) noise transient results from capacitive coupling from the GATES of N1 and N2 (in FIG. 1 ) to the Pwell and from the logic level changes at the DRAINs of N1 and N2 capacitively coupling into the Pwell. The Pwell is connected to Vss through the Pwell sheet resistor and capacitively coupled to Vdd. FIG. 1 illustrated the basic switching kernel of LNL.

The average propagation delay of LNL, when operated with an $I_B$ of 32 μA, is approximately 2.8X that of standard CMOS logic. LNL varies less with temperature than Standard CMOS and does not vary with changes in Vdd over the Vdd range of 4.50 V to 5.50 V. The reduction of Iss noise transients placed on Vss for LNL is 57 to 66 dB less than the Iss transients encountered with standard CMOS.

The enhanced quality of the Vss distribution system in an LNL system enables lower level analog signals to be processed in a mixed signal application. The Delay vs. $I_B$ relationship enables LNL to operate with constant delay when $V_{BIAS}$ is provided from a phase locked loop that utilizes an LNL ring oscillator as the voltage controlled oscillator. Some applications for LNL include secure data communications, modems, correlators, phase locked loops, fiber optic decoding, focal plane digital signal processing, d/a conversion, a/d conversion, precision clock generators, high precision asynchronous digital delay lines and etc.

For example, if there is 28 mv of noise on Vss (the system reference voltage), the minimum voltage that could be accurately converted to a binary value, for various bit lengths, is shown in Table 1. The least significant bit could not resolve voltage levels less than the Vss system noise (28 mV). Also, remember that a sensitivity increase of 60dB represents a possible increase in bit accuracy of 10 bits, where switching noise continues to determine the limit on sensitivity. Equation 11 provides the relationship between noise on Vss and the minimum voltage that may be accurately resolved with one sample.

TABLE 1

A/D resolution in the presence of
Vss noise (28 mv Peak noise on Vss)

| CONVERSION BIT LENGTH | MINIMUM ACCURATE VOLTAGE RESOLUTION |
|---|---|
| 8 | 7.168V |
| 10 | 28.672V |
| 12 | 114.688V |
| 14 | 458.752V |
| 16 | 1835.008 |
| 18 | 7340.032V |
| 20 | 29360.128V |

Minimum Resolution = (Vss noise)*$2^{BIT\ LENGTH}$ (11)

The LNL family of the invention develops a maximally quite logic which is quite enough for many applications. The advantages of the LNL family include (1) at least 5000 gates per watt to allow for complex logic functions to be implemented, (2) flip-flop to flip-flop data transmission rate of 20 MHz with three levels of logic between flip-flops, (3) operating temperature range of −55C.° to +125° C., (4) operating voltage range of +4.5 V to +5.5 V, (5)noise reduction greater than 50dB, (6) capability to interface with standard CMOS logic, (7) require only one power supply voltage (Vdd).

One use for this LNL family is in mixed signal disciplines where both analog and digital partitions are present on the same integrated circuit. Often, digital noise on Vss and Vdd determines the noise floor, below which analog signals disappear into the noise. A typical mixed signal application is the conversion of an analog voltage to a digital sequence. Other applications include data security, phase locked loops, correlators, modems, fiber optic decoding and focal plane signal processing.

Figure 2:
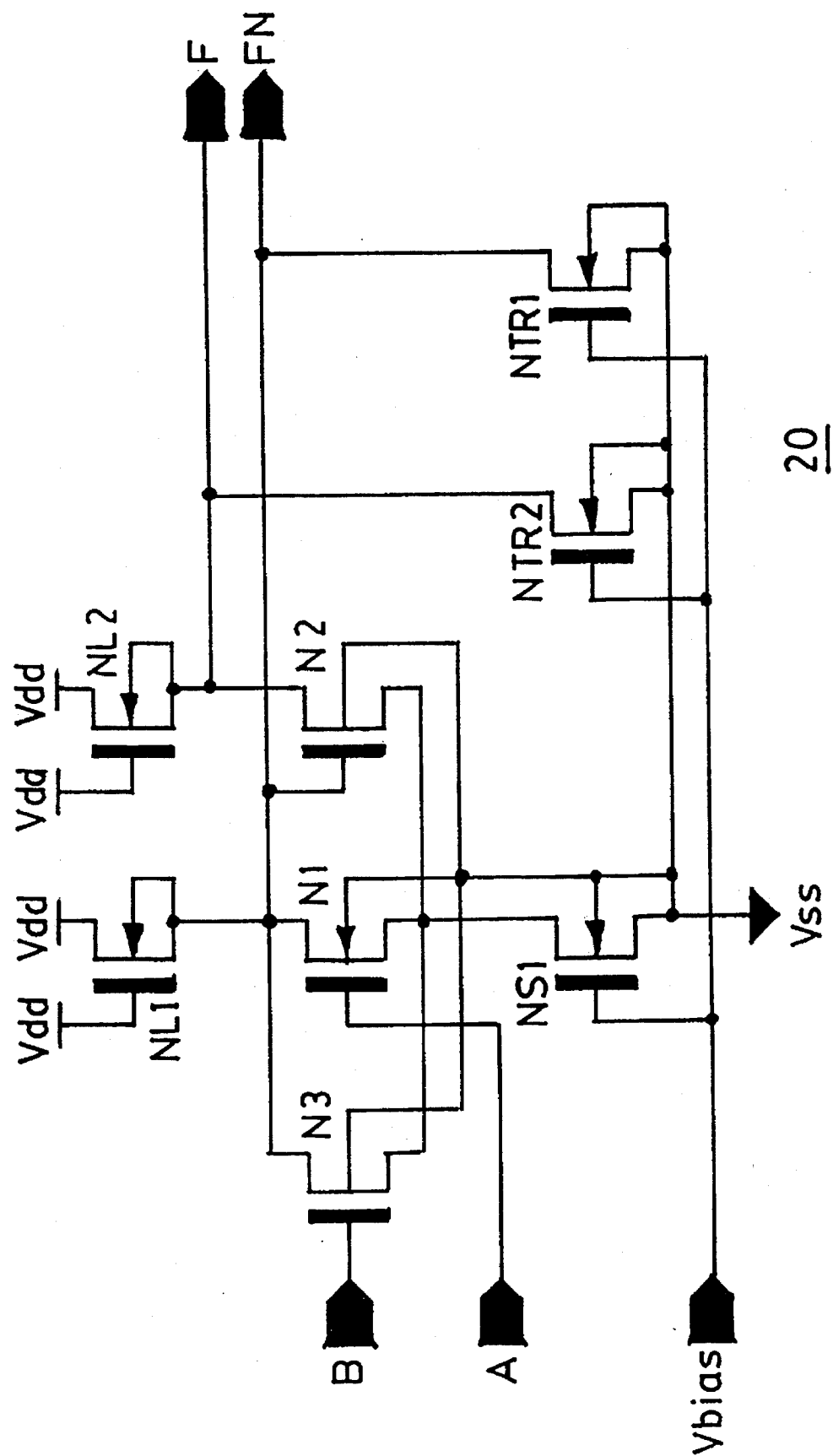
FIG. 2 shows a schematic representation of a NOR/OR circuit.

Reference is made to FIG. 2 where is shown a typical NOR circuit 20 made with the invention. Logic states in NOR circuit 20 are determined by the path that a constant current takes from Vdd to Vss. NOR circuit 20 has a constant current generator NS1, a set of current steering devices N1, N2 and N3 and nonlinear load devices NL1 and NL2 for the true and complement outputs, F and FN respectively. The inclusion of N3 in parallel with N1 produces a 2-input NOR/OR function. If N3 were not present, the circuit of FIG. 2 would be the same as that of FIG.1, i.e., an Inverter/Buffer. Two current trickle devices NTR1, NTR2 maintain small levels of conduction current in NL1 (or NL2) while the bias current provided by NS1 is not flowing in NL1 (or NL2). Trickle current lowers the output impedance and insures logical operation when there is more junction leakage in the non-linear loads than there is in the current steering devices. Without trickle devices, the leakage in NL1 might be able to dominate node FN. The logical 1 state at the FN output might rise, in response to the leakage of NL1, to levels significantly more positive than Vdd−$V_{tO}$. In this case, loss of state control by input A and/or B would occur.

Having thus described the preferred embodiment of the logic kernel 10 of the invention, those skilled in the art will recognize that numerous variations, modification, additions and combinations can be made to the invention that are within the spirit and scope of the appended claims. Included but not limited to such modifications is the ability to implement the LNL family in bipolar technology by substituting NPN transistors for the NMOS transistors of kernel 10. Those skilled in the art will also recognize that different types of logic circuits and devices including AND, OR, and NAND, gates may be made using the above kernel 10 as a modular unit. Such further logic gates will have the common characteristic of a constant current source disposed between the switching transistors and the second or low voltage reference source. They will have the further characteristic of a constant current during switching with logical changes in output being accomplished by steering current between two or more load devices.

What we claim is:

1. A low noise logic circuit comprising:

a first reference voltage source coupled to first and second loads;

a constant current source coupled to a second reference voltage source;

a first MOS switching transistor coupled between the first load and the constant current source and a second MOS switching transistor coupled between the second load and the constant current source, said second MOS switching transistor having its gate coupled to the drain of the first MOS switching transistor, said first MOS switching transistor for steering the current from the constant current source to the first load in accordance with a first logic level applied to said first MOS switching transistor and said second MOS transistor for steering current from the current source to the second load in accordance with a second logic level applied to said first MOS switching transistor.

2. The low noise logic circuit of claim 1 wherein said first and second loads are nonlinear loads.

3. The low noise logic circuit of claim 2 wherein said first and second loads are MOS transistors.

4. The low noise logic circuit of claim 1 wherein said constant current source is a MOS transistor.

5. The low noise logic circuit of claim 4 wherein said MOS transistor of Said constant current source has its gate coupled to a bias voltage source.

6. The low noise logic circuit of claim 1 wherein the sources of the first and second MOS switching transistor are coupled together.

7. The low noise logic circuit of claim 1 wherein the first and second loads are respectively connected to the drains of the first and second MOS switching transistors.

8. The low noise logic circuit of claim 1 wherein the source of the MOS transistor of the constant current source transistor is coupled to ground.

9. The low noise logic circuit of claim 1 further comprising an input coupled to the gate of the first MOS switching transistor, a first output coupled to the drain of the first MOS switching transistor and a second output coupled to the drain of the second MOS switching transistor.

10. The low noise logic circuit of claim 9 wherein the two outputs have a voltage differential corresponding to first and second logic levels.

11. The low noise logic circuit of claim 9 further comprising first and second trickle loads coupled respectively to said first and second outputs.

12. The low noise logic circuit of claim 11 wherein said first and second trickle loads are coupled to said second reference voltage source.

13. The low noise logic circuit of claim 12 wherein said first and second trickle loads comprise first and second trickle MOS transistors.

14. The low noise logic circuit of claim 13 wherein said first and second trickle transistors are coupled to the second reference voltage.

15. The low noise logic circuit of claim 14 wherein the second reference voltage is ground.

16. A low noise method for switching between logic circuit states comprising:

providing a first reference voltage source coupled to first and second nonlinear loads;

providing a constant current source coupled to a second reference voltage source;

receiving an input logic signal having one of two logic states; steering the current from the constant current source to the nonlinear first load when the input logic signal has one state and steering the current from the constant current source to the second nonlinear load when the input logic signal has said other state;

providing a first output signal in accordance with said input logic signal whereby noise is reduced at said first and second reference voltage sources.

17. The method of claim 16 wherein the second reference voltage is ground.

18. The method of claim 16 further comprising trickling a portion of the current from one of the loads to the second reference voltage source.

19. A low noise logic circuit comprising:

a voltage source and first and second loads coupled to said voltage source;

first and second switching transistors, each switching transistor having control, input and output electrodes with the input electrode of the first switching transistor coupled to the first load and the input electrode of the second switching transistor coupled to the second load;

a constant current source coupled between the output electrodes of the first and second switching transistors and ground;

the control electrode of the first switching transistor for receiving first and second logic levels and coupling the current source to the first load for the first logic level;

the control electrode of the second switching transistor coupled to the input of the first switching transistor for coupling the current source to the second load for the second logic level whereby noise is reduced at said voltage source and at ground.

20. A low noise logic circuit comprising:

a first reference voltage source coupled to first and second loads;

a constant current source coupled to a second reference voltage source;

a first MOS switching transistor coupled between the first load and the constant current source for steering current from the current source to the first load in accordance with a first logic level and a second MOS switching transistor coupled between the second load and the constant current source for steering current from the current source to the second load in accordance with a second logic level;

a first trickle load device coupled between the first load and the second reference voltage source and a second trickle load coupled between the second load and the second reference voltage source.

21. The low noise logic circuit of claim 20 wherein the first and second loads comprise first and second nonlinear loads.

22. The low noise logic circuit of claim 20 wherein the first and second loads are MOS transistors.

23. The low noise logic circuit of claim 20 wherein said first and second trickle loads comprise first and second trickle MOS transistors.

24. The low noise logic circuit of claim 20 having first and second outputs coupled respectively to the drains of the first and second MOS switching transistors and the first trickle load is coupled between the first output and the second reference voltage source and the second trickle load is coupled between the second output and the second reference voltage source.

25. The low noise logic circuit of claim 20 wherein the first and second loads comprise, respectively, first and second MOS nonlinear load transistors, the first and second trickle loads comprise, respectively, first and second trickle load MOS transistors, and the source of the first MOS load transistor is coupled to the drain of the first trickle load MOS transistor and the source of the second MOS load transistor is coupled to the drain of the second trickle load MOS transistor.

26. A low noise logic circuit comprising:

a first reference voltage source coupled to first and second nonlinear loads;

a controlled constant current source coupled to a second reference voltage source;

a first MOS switching transistor coupled between the first load and the constant current source and a second MOS switching transistor coupled between the second load and the constant current source, said first MOS switching transistor for steering the current from the constant current source to the first load in accordance with a first logic level applied to said first MOS switching transistor and said second MOS switching transistor for steering current from the current source to the second load in accordance with a second logic level applied to said first MOS switching transistor.

27. The low noise logic circuit of claim 26 wherein said first and second nonlinear loads are MOS transistors.

28. The low noise logic circuit of claim 27 wherein said controlled constant current source is a MOS transistor.

29. The low noise logic circuit of claim 28 wherein all of the MOS transistors are devices of the same mode.

30. The low noise logic circuit of claim 29 wherein the transistors are all enhancement mode devices.

31. The low noise logic circuit of claim 28 wherein said MOS transistor of said controlled constant current source has its gate coupled to a bias voltage source wherein the constant current is controlled by the bias voltage on the gate.

32. The low noise logic circuit of claim 28 wherein the source of the MOS transistor of the constant current source transistor is coupled to ground.

33. The low noise logic circuit of claim 26 wherein the gate of the second MOS switching transistor is coupled to the drain of the first transistor.

34. The low noise logic circuit of claim 26 wherein the sources of the first and second MOS switching transistor are coupled together.

35. The low noise logic circuit of claim 26 wherein the first and second loads are respectively connected to the drains of the first and second MOS switching transistors.

36. The low noise logic circuit of claim 26 further comprising an input coupled to the gate of the first MOS switching transistor, a first output coupled to the drain of the first MOS switching transistor and a second output coupled to the drain of the second MOS switching transistor.

37. The low noise logic circuit of claim 36 wherein the two outputs have a voltage differential corresponding to the first and second logic levels.

38. The low noise logic circuit of claim 34 further comprising first and second trickle loads coupled respectively to said first and second outputs.

39. The low noise logic circuit of claim 36 wherein said first and second trickle loads are coupled to said second reference voltage source.

40. The low noise logic circuit of claim 37 wherein said first and second trickle loads comprise first and second trickle MOS transistors.

41. The low noise logic circuit of claim 40 wherein said first and second trickle transistors are coupled to the second reference voltage.

42. The low noise logic circuit of claim 41 wherein the second reference voltage is ground.

* * * * *